(12) United States Patent
Iliasevitch

(10) Patent No.: US 6,211,660 B1
(45) Date of Patent: Apr. 3, 2001

(54) MOS TRANSISTOR OUTPUT CIRCUITS USING PMOS TRANSISTORS

(75) Inventor: Stepan Iliasevitch, Nepean (CA)

(73) Assignee: Nortel Networks, Limited, Montreal (CA)

( * ) Notice: Subject to any disclaimer, the term of this patent is extended or adjusted under 35 U.S.C. 154(b) by 0 days.

(21) Appl. No.: 09/592,779

(22) Filed: Jun. 13, 2000

(51) Int. Cl.⁷ ........................................ G05F 3/16
(52) U.S. Cl. .................. 323/315; 327/540; 327/542
(58) Field of Search .................... 323/311, 312, 323/315, 316, 317; 330/257, 288; 327/77, 90, 541, 540, 542, 543

(56) References Cited

U.S. PATENT DOCUMENTS

| | | | |
|---|---|---|---|
| 4,912,347 | * 3/1990 | Morris | 323/317 X |
| 6,064,267 | * 5/2000 | Lewyn | 323/315 X |
| 6,094,041 | * 7/2000 | Wachter | 323/315 |

* cited by examiner

Primary Examiner—Jessica Han

(57) ABSTRACT

A signal voltage converter converts a 0V to −5V input signal to a +5V to 0V output signal using PMOS transistors for both pull-up and pull-down of the output. Bipolar transistor level shifters and PMOS current mirrors are used to control the pull-up and pull-down transistors in conjunction with a clamp circuit. Output signal transitions are matched for both transition directions to reduce signal timing distortion, and this can be further enhanced by an optional circuit for supplying a controlled current for the clamp circuit.

20 Claims, 3 Drawing Sheets

MOS TRANSISTOR OUTPUT CIRCUITS USING PMOS TRANSISTORS

This invention relates to MOS (metal-oxide-semiconductor field effect) transistor output circuits using PMOS transistors. The invention is particularly applicable but is not limited to, and is described below in the context of, a signal voltage converter for converting between signal voltages in MOS circuits which have different supply voltages. MOS circuits include CMOS (complementary MOS) and BCMOS (bipolar and CMOS) circuits which may be used for handling signals at very high frequencies, for example of the order of 5 GHz.

BACKGROUND

It is known to provide for example a BCMOS circuit with supply voltages of +5, 0, and −5 volts, in which signal voltages are between 0 and −5 volts, being close to 0 volts and −5 volts to represent logic levels 1 and 0 respectively. In order to couple such a signal to another (e.g. integrated circuit) device which operates with supply voltages of +5 and 0 volts, it is necessary to convert the signal to voltage levels between +5 and 0 volts, in particular so that the signal logic levels are represented by typical CMOS voltage levels close to +5 volts and 0 volts to represent logic levels 1 and 0 respectively.

This signal conversion involves a shifting of the signal voltage by +5 volts for each logic level, and while this is simple in concept, in practice it presents challenges which arise from voltage constraints and characteristics of the technology that may be used for producing the integrated circuits, in conjunction with needs to maintain a desired frequency response or signal bandwidth and to avoid distortion of signal timing.

As is well known, a CMOS output circuit having supply voltages of +5 and 0 volts comprises a PMOS transistor for pulling the signal voltage up so that it is close to +5 volts and an NMOS transistor for pulling the signal voltage down so that it is close to 0 volts. Such an output circuit determines the typical CMOS signal voltages for logic 1 and 0 levels for which input circuits of CMOS devices are designed. However, for example in a BCMOS integrated circuit having supply voltages of +5, 0, and −5 volts, while it is practical to provide a PMOS transistor which is insulated from the substrate so that it can operate at independent voltage levels, an NMOS transistor can only practically be provided if its source is connected to the substrate, which is at the negative voltage of −5 volts. Consequently, it is not practical to provide an output circuit with an NMOS transistor for pulling down the signal to the level of close to 0 volts as is required.

In the prior art, it is known to address this difficulty by instead using an NPN bipolar transistor of the BCMOS integrated circuit for pulling down the signal to the logic 0 level of close to 0 volts. However, such bipolar transistors have collector-emitter voltages which may be greater than a maximum required logic 0 signal voltage level unless the transistor is driven into saturation, which limits high frequency operation. In addition, typical capacitive loading of the output produces different time constants for different signal transitions (logic 0 to 1 and logic 1 to 0 transitions) due to the different characteristics of the pull-up and pull-down transistors. This results in a distortion of signal timing. For example, in a signal voltage converter an input signal with a 50% duty cycle will produce a voltage-converted output signal with a duty cycle that is not 50%.

It is also necessary, in any such signal voltage converter or other circuit implemented using a technology for which voltage limits between terminals of the transistors are less than the total supply voltage, to ensure that these limits are not generally exceeded in operation of the circuit. For example, such a voltage limit may be a maximum of 6 volts between any two terminals of the same transistor, compared with a total supply voltage of 10 volts for supplies of +5 volts and −5 volts.

A need therefore exists to provide an improved MOS transistor output circuit, and an improved signal voltage converter using such an output circuit.

SUMMARY OF THE INVENTION

One aspect of this invention provides a MOS transistor output circuit having terminals for relatively positive, zero, and negative supply voltages, comprising: a first PMOS transistor having a source connected to the positive supply voltage, a gate, and a drain connected to an output; a second PMOS transistor having a source connected to the output, a gate, and a drain connected to the zero supply voltage; at least one current mirror arrangement comprising at least a third PMOS transistor having a source connected to the positive supply voltage, a gate, and a drain, the at least one current mirror arrangement being responsive to an input signal for controlling the first and third PMOS transistors via their gates to be simultaneously conductive and simultaneously non-conductive for respective logic levels of the input signal; a fourth PMOS transistor having a source coupled to the drain of the third PMOS transistor, a gate coupled to the zero voltage supply, and a drain coupled to the gate of the second PMOS transistor; and a clamp circuit coupled to the gate of the second PMOS transistor and responsive to the input signal for supplying a relatively positive or negative voltage to the gate of the second PMOS transistor, to render the second PMOS transistor respectively non-conductive or conductive, when the first and third PMOS transistors are respectively conductive and non-conductive.

In particular, the input signal may have voltages between the zero and negative supply voltages, the output circuit further comprising at least one level shifter responsive to the input signal for conducting an input current of said at least one current mirror arrangement, the at least one level shifter comprising an NPN bipolar transistor having a base coupled to the zero supply voltage, an emitter coupled via a resistor to a signal path, and a collector coupled to the at least one current mirror arrangement.

Another aspect of the invention provides a MOS transistor signal voltage converter having relatively positive, zero, and negative supply voltages for converting an input signal having logic levels represented by voltages at about the zero and negative supply voltages to an output signal having logic levels represented by voltages at about the positive and zero supply voltages, the converter comprising: a first PMOS transistor having a source connected to the positive supply voltage, a gate, and a drain connected to an output for the output signal; a second PMOS transistor having a source connected to the output, a gate, and a drain connected to the zero supply voltage; at least one level shifter comprising an NPN bipolar transistor having a base coupled to the zero supply voltage, an emitter coupled to a signal path responsive to the input signal, and a collector; at least one current mirror arrangement coupled to the collector of the at least one level shifter and including at least a third PMOS transistor having a source connected to the positive supply voltage, a gate, and a drain, the at least one current mirror arrangement being responsive to current conducted by the transistor of the at least one level shifter to control the first and third PMOS transistors via their gates to be simultaneously conductive and simultaneously non-conductive for respective logic levels of the input signal; a fourth PMOS transistor having a source coupled to the drain of the third PMOS transistor, a gate coupled to the zero voltage supply, and a drain coupled to the gate of the second PMOS transistor; and a clamp circuit coupled to the gate of the second PMOS transistor and responsive to the input signal for controlling the second PMOS transistor to be respectively non-conductive and conductive when the first and third PMOS transistors are respectively conductive and non-conductive.

The clamp circuit can comprise a first terminal responsive to the input signal; a second terminal coupled to the gate of the second PMOS transistor; and a third terminal coupled to the zero supply voltage; a potential divider coupled between the first and second terminals; an NPN bipolar transistor having a base coupled to a tapping point of the potential divider, an emitter coupled to the first terminal, and a collector coupled to the second terminal; a path between the third terminal and the base of the transistor comprising a resistor and at least one diode for conducting current when the first terminal is at a negative voltage; and a path between the third terminal and the collector of the transistor including said resistor and at least one other diode for conducting current when the first terminal is at a negative voltage.

The circuit can further comprise a controlled current circuit responsive to the input signal and having an output to which the first terminal of the clamp circuit is coupled, the controlled current circuit being arranged to conduct a controlled current for the clamp circuit when the second PMOS transistor is conductive.

BRIEF DESCRIPTION OF THE DRAWINGS

The invention will be further understood from the following description by way of example with reference to the accompanying drawings, in which.

DETAILED DESCRIPTION

Figure 1:
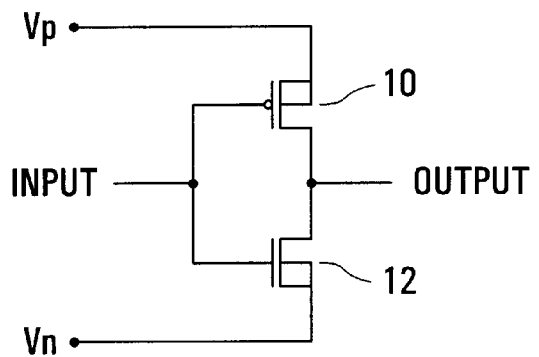
FIG. 1 schematically illustrates a known CMOS inverting output circuit.

Referring to FIG. 1, a known CMOS inverting output circuit comprises a PMOS transistor 10 and an NMOS transistor 12 whose gates are coupled together to receive a CMOS input signal and whose drains are coupled together to provide a CMOS output signal. A source of the PMOS transistor 10 is coupled to a relatively positive supply voltage Vp (for example, +5 volts), and a source of the NMOS transistor 12 is coupled to a relatively negative supply voltage Vn (for example, 0 volts).

As is well known, a logic 0 level constituted by a voltage close to Vn at the input causes the PMOS transistor 10 to be conductive and the NMOS transistor 12 to be non-conductive, so that the output is at a logic 1 level with a voltage close to Vp. Conversely, a logic 1 level constituted by a voltage close to Vp at the input causes the PMOS transistor 10 to be non-conductive and the NMOS transistor 12 to be conductive, so that the output is at a logic 0 level with a voltage close to Vn. The pull-up operation of the PMOS transistor 10 and the pull-down operation of the NMOS transistor 12 facilitate rapid transitions between these logic levels and consequent operation at high signal frequencies.

In the implementation of such circuits using BCMOS technology, typically PMOS transistors are fabricated in an N-type semiconductor well so that they are insulated from the substrate and can be operated at voltage levels relatively independent of the substrate voltage. This is not the case for NMOS transistors, for which the source of the transistor is connected to the same voltage as the substrate.

Thus the use of the NMOS transistor 12 in the circuit of FIG. 1 implemented using such technology requires that the voltage Vn be the substrate voltage. This presents a problem in the event that it is desired to use a substrate at a more negative voltage, for example −5 volts for signal voltage levels between 0 volts and +5 volts.

Figure 2:
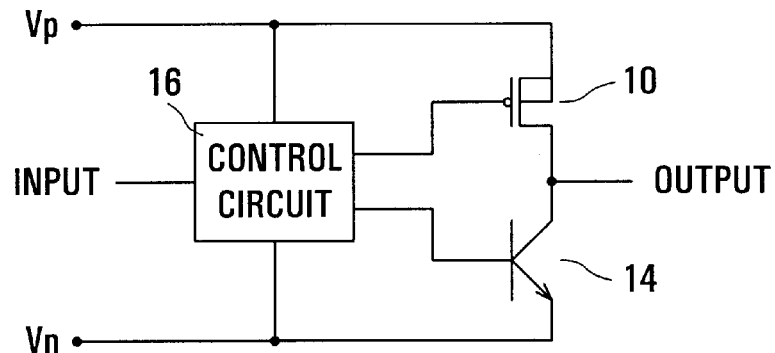
FIG. 2 schematically illustrates a known BCMOS inverting output circuit using a PMOS pull-up transistor and an NPN bipolar pull-down transistor.

This problem has been addressed in the prior art by a circuit as illustrated in FIG. 2, in which the NMOS transistor 12 of the circuit of FIG. 1 is replaced by an NPN bipolar transistor having its collector coupled to the output and its emitter coupled to the supply voltage Vn. In the circuit of FIG. 2 the input signal is supplied to a control circuit 16, which supplies appropriate drive signals to the gate of the PMOS pull-up transistor 10 and to the base of the NPN bipolar pull-down transistor 14. However, the circuit of FIG. 2 has significant disadvantages.

In particular, the characteristics of the transistors 10 and 14 are not matched to one another due to the different nature of these transistors. Consequently, with a typical capacitive load connected to the output, the speeds of transitions from logic 0 to logic 1 output levels (pull-up by the transistor 10) and transitions from logic 1 to logic 0 output levels (pull-down by the transistor 14) can be significantly different, resulting in different delays and distortion of signal timing which is unacceptable at high signal frequencies. In addition, in order for the logic 0 output voltage level to be close to Vn as may be required, it can be necessary to drive the NPN bipolar pull-down transistor 14 into saturation, which is undesirable in particular because it adversely affects the speed and hence the signal bandwidth of the circuit.

Figure 3:
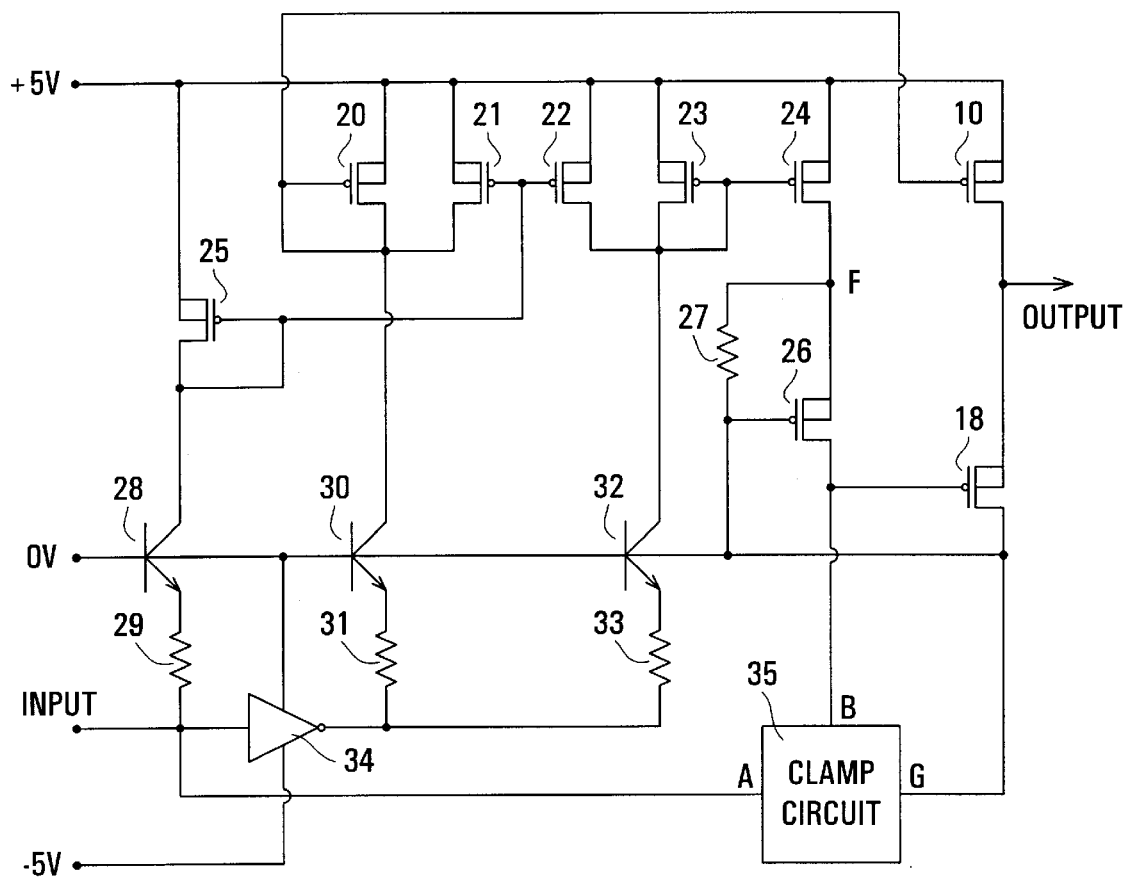
FIG. 3 schematically illustrates a signal voltage converter incorporating an output circuit in accordance with an embodiment of this invention.

In an output circuit in accordance with this invention, in effect the NMOS transistor 12 in the circuit of FIG. 1 is replaced by another PMOS transistor, referenced 18 in the circuit of FIG. 3 described below, and a control circuit is provided for controlling the gates of the two PMOS transistors 10 and 18 with opposite phases in response to the input signal. FIG. 3 incorporates such an arrangement of PMOS transistors 10 and 18 in a signal voltage converter in accordance with an embodiment of this invention.

Referring to FIG. 3, the signal voltage converter illustrated therein has supply voltages of +5, 0, and −5 volts, and serves to provide signal voltage conversion from a CMOS input signal having signal voltages between 0 and −5 volts to a CMOS output signal having signal voltages between +5 and 0 volts. More particularly, at the input a logic 1 is represented by a signal voltage which is close to (slightly more negative than) 0 volts and a logic 0 is represented by a signal voltage which is close to (slightly more positive than) −5 volts; for simplicity these input signal voltages are referred to below as about 0 volts and about −5 volts respectively. At the output a logic 1 is represented by a signal voltage which is close to (slightly more negative than) +5 volts and a logic 0 is represented by a signal voltage which is close to (slightly more positive than) 0 volts; for simplicity these output signal voltages are referred to below as about +5 volts and about 0 volts respectively.

In addition to the PMOS transistors 10 and 18 referred to above, the signal voltage converter of FIG. 3 comprises PMOS transistors 20 to 26; a resistor 27; three level shifters constituted by respective NPN bipolar transistors 28, 30, and 32 with respective resistors 29, 31, and 33 connected in series with their emitters, the base of each of these transistors being connected to the 0 volt supply; a CMOS inverter 34; and a clamp circuit 35 which can be as described below with reference to FIG. 4.

An input terminal for the input signal is connected to a terminal A of the clamp circuit 35 and to an input of the inverter 34. This inverter is connected to the 0V and −5V supplies as supply voltages and can be a conventional CMOS inverter with an output circuit using complementary MOS transistors as shown in FIG. 1. The emitter of the transistor 28 is coupled to the input terminal via the emitter resistor 29, and the emitters of the transistors 30 and 32 are coupled to the output of the inverter 34 via the emitter resistors 31 and 33 respectively.

The collectors of the transistors 28, 30, and 32 are connected to the gate and drain of the PMOS transistors 25, 20, and 23 respectively, each of which has its source coupled to the +5V supply and constitutes an input transistor of a respective current mirror. The PMOS transistors 21 and 22 have their sources and drains connected to the sources and drains of the transistors 20 and 23 respectively, and have their gates connected to the gate of the transistor 25 in a first current mirror arrangement. The PMOS transistor 10 has its source connected to the +5V supply voltage, its drain connected to the output, and its gate connected to the gate of the transistor 20 in a second current mirror arrangement. The PMOS transistor 24 has its source connected to the +5V supply voltage and its gate connected to the gate of the transistor 23 in a third current mirror arrangement. The PMOS transistor 26 has its source connected to the drain of the transistor 24, its gate connected to the 0V supply voltage, and its drain connected to a terminal B of the clamp circuit 35 and to the gate of the PMOS transistor 18, whose source is connected to the output and whose drain is connected to the 0V supply voltage. A junction point F between the drain of the transistor 24 and the source of the transistor 26 is coupled via the resistor 27 to the 0V supply voltage, and a terminal G of the clamp circuit 35 is also connected to the 0V supply voltage.

In operation of the signal voltage converter of FIG. 3, with a logic 1 input signal of about 0 volts the transistor 28 has no base-emitter bias so that it does not conduct, and consequently the transistors 25, 21, and 22 of the first current mirror arrangement are non-conductive. The inverter 34 produces an output of about −5 volts, so that the transistor 30 conducts a current determined by the voltage dropped across the resistor 31 divided by the resistance of this resistor. The voltage dropped across the resistor is about 5 volts minus Vbe, where Vbe is the base-emitter forward voltage of each of the bipolar transistors. The current flow via the collector-emitter path of the transistor 30 is conducted via the transistor 20 and is mirrored, with a desired current gain in the second current mirror arrangement, to turn on the transistor 10 so that this pull-up transistor is conductive to produce an output logic 1 level of about +5 volts. Similarly, the transistor 32 conducts a current dependent upon the resistance of the resistor 33, and this flows via the transistor 23 which turns on the transistor 24 with a desired current gain in the third current mirror arrangement, so that the junction point F is pulled up to about +5 volts by the conductive transistor 24.

At the same time, as further described below the clamp circuit 35, supplied with voltages of 0V at its terminal G and about 0V at its terminal A, provides a relatively high impedance at its terminal B, and the transistor 26 is turned on and conductive because its gate is at a voltage of 0V. Consequently, the conductive transistors 24 and 26 provide a pull-up to +5 volts of the voltage supplied to the gate of the transistor 18, and accordingly the transistor 18 is non-conductive.

When the input signal becomes a logic 0 or about −5 volts, the output of the inverter 34 becomes about 0V so that the transistors 30 and 32 no longer conduct, and consequently there is also no current flow via the current mirror input transistors 20 and 23, so that the transistors 10 and 24 are turned off and become non-conductive. With the −5 volt input signal voltage the transistor 28 has its base-emitter junction forward biassed so that it conducts a current dependent upon the resistance of the resistor 29, this current flowing via the transistor 25 and being mirrored by the transistors 20 and 21 of the first current mirror arrangement to ensure a rapid turn-off of the input transistors 20 and 23 of the second and third current mirror arrangements.

At this time, as further described below the clamp circuit 35, supplied with voltages of 0V at its terminal G and about −5V at its terminal A, produces at its terminal B a voltage of about −5V plus Vbe (i.e. about −4.2V). This negative voltage is supplied to the gate of the transistor 18, which accordingly is turned on to pull down the output voltage to about 0 volts. At the same time, the transistor 26 is turned off so that it is non-conductive, and the resistor 27, which can have a high resistance because at this time the transistors 24 and 26 are turned off, serves to tie the junction point F to 0 volts. Otherwise the junction point F would have an indefinite voltage at this time, which could present a risk of an excessive voltage difference being applied to one of the transistors 24 and 26.

Figure 4:
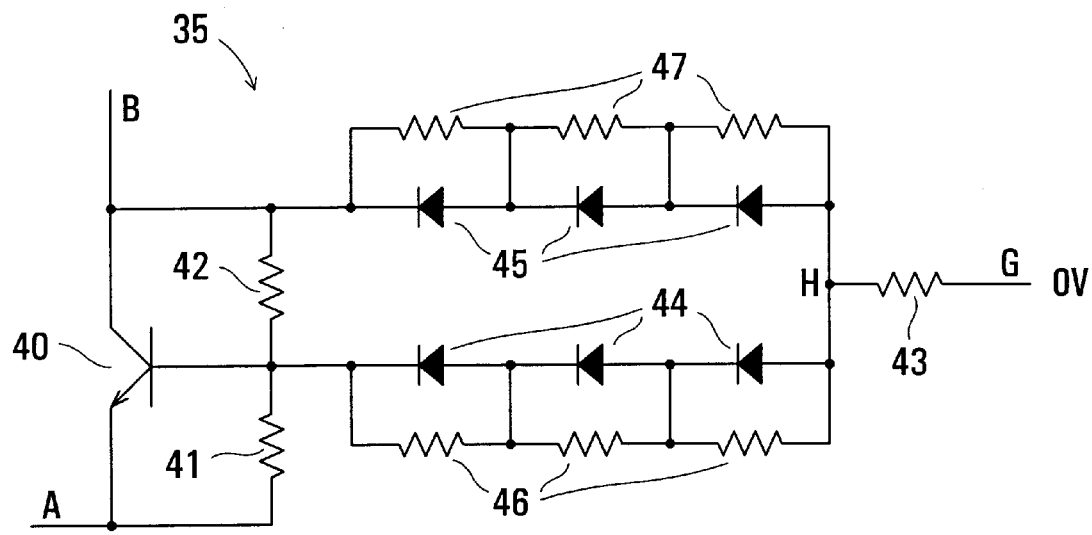
FIG. 4 schematically illustrates one form of a clamp circuit of the signal voltage converter of FIG. 3.

FIG. 4 illustrates one form of the clamp circuit 35, which includes an NPN bipolar transistor 40 having its emitter and its collector connected to the terminals A and B respectively of the clamp circuit 35 and via resistors 41 and 42 respectively to the base of the transistor 40. The terminal G of the clamp circuit 35, which is connected to the 0V supply voltage as described above, is coupled to a junction point H via a resistor 43. The junction point H is coupled to the base of the transistor 40 via three series-connected diodes 44, and to the collector of the transistor 40 via another three series-connected diodes 45. The diodes 44 and 45 are poled for conducting current from the junction point H towards the base and collector, respectively, of the transistor 40, and may be constituted by diode-connected transistors in known manner. Although in each case there are three diodes connected in series, thereby providing a forward voltage drop of the order of 2.4 volts, different numbers of diodes can alternatively be provided to provide different voltage drops. Three resistors 46 are connected in parallel with respective ones of the three diodes 44, and three resistors 47 are connected in parallel with respective ones of the three diodes 45. The resistors 46 and 47 have relatively high resistances and serve to equalize voltage drops of the diodes in known manner.

When the terminal A has a voltage of about −5 volts as described above, the transistors 24 and 26 are non-conductive as also described above, and substantially no current flows via the terminal B of the clamp circuit 35. The diodes 44 and the base-emitter junction of the transistor 40 are forward biassed via the resistor 43, so that the transistor 40 conducts a collector-emitter current via the resistor 43 and the diodes 45 which are also forward biassed. Due to the gain 20 of the transistor 40, the collector-emitter current of the transistor 40 is much larger than the base-emitter current of this transistor, so that this current flow is limited by an increasing voltage drop across the resistor 43 which tends to reduce the base-emitter drive to the transistor. Consequently, a dynamic equilibrium point is reached in which the transistor 40 is prevented from going into saturation. In this equilibrium point the voltage at the junction point H is equal to that at the terminal A (about −5V) plus the base-emitter voltage Vbe of the transistor 40 and the total forward voltage drop of the diodes 44 (e.g. 3Vbe for three diode-connected transistors), and the voltage at the collector of the transistor 40 is more negative than this by the total forward voltage drop of the diodes 45 (e.g. 3Vbe for three diode-connected transistors). Thus the voltage at the collector of the transistor 40, and hence at the terminal B as described above, is about −5V plus Vbe.

When the input signal becomes a logic 1 so that the terminal A has a voltage of about 0 volts as described above, the transistors 24 and 26 become conductive as also described above, the voltage at the terminal B is pulled up to +5 volts, and the diodes 44 and 45 are no longer forward biassed. The transistor 40 and the potential divider formed by the resistors 41 and 42 provide for a limited current flow via the terminal B of the clamp circuit 35, corresponding to the relatively high impedance presented by the clamp circuit 35 at the terminal B as referred to above.

It can be appreciated that in the circuit of FIG. 3 the pull-down transistor 18 enables the required logic 0 output voltage to be provided in a similar manner to that provided for the logic 1 output voltage provided by the pull-up transistor 10, so that the required logic 0 output voltage is provided with transition times between the logic levels which are substantially the same for both transition directions, so that signal time or duty cycle distortion is reduced or avoided. These transition times can be further controlled, so that they are even more similar to one another, by adjustment of the gains of the current mirror arrangements, and/or by providing a controlled current to the clamp circuit 35 for example as described below. In addition, the circuit of FIG. 3 avoids saturation of any bipolar transistor, in particular the transistor 40 in the clamp circuit 35, so that there is no adverse effect on the signal bandwidth of the circuit due to transistor saturation.

The signal voltage converter described above can also be simplified from its form shown in FIG. 3. For example, if particularly rapid turn-off of the transistors 20 and 23 is not required, then the first current mirror arrangement comprising the transistors 25, 21, and 22, and its drive circuit comprising the level shifter transistor 28 and resistor 29, can be omitted. In addition, since the transistors 10 and 24 are driven with the same phase, the transistor 23, and its drive circuit comprising the level shifter transistor 32 and resistor 33, can also be omitted, the gate of the transistor 24 instead being connected to the gate of the transistors 10 and 20, with appropriate current mirror gains for the respective transistors 10 and 24.

The signal voltage converter described above can also be made more sophisticated, with even better control over the timing of transitions between the two output logic levels so that these are closely matched, by providing a controlled current circuit for the clamp circuit 35, this controlled current circuit being matched to the current mirror arrangements in the circuit of FIG. 3. By way of example, FIG. 5 illustrates one form of a controlled current circuit which may optionally be included in the circuit of FIG. 3.

Figure 5:
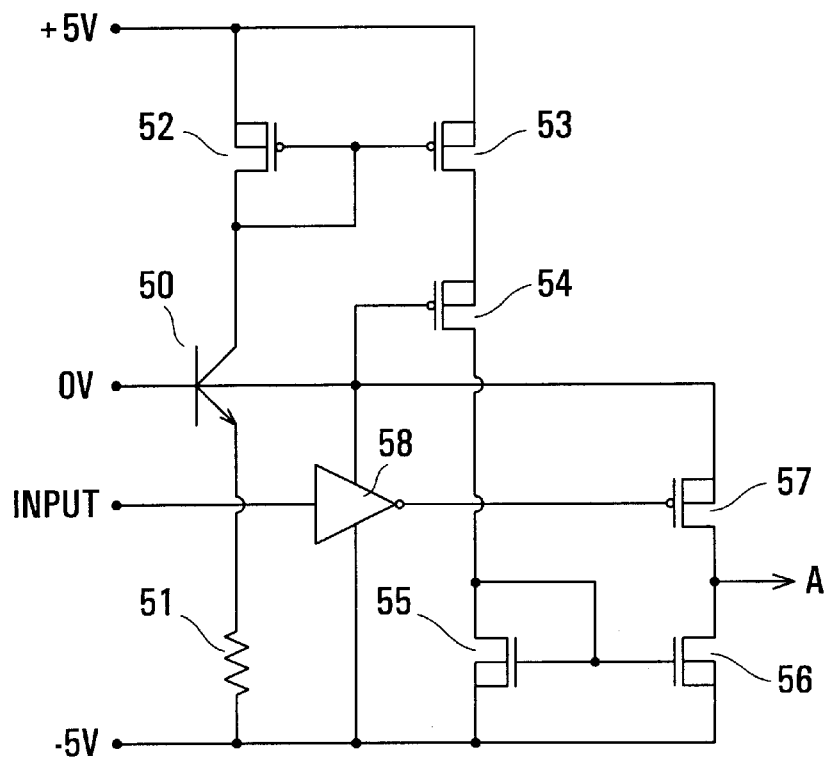
FIG. 5 schematically illustrates a controlled current circuit which may optionally be included in the circuit of FIG. 3.

Referring to FIG. 5, the controlled current circuit shown therein comprises an NPN bipolar transistor 50 having its base connected to the 0V supply voltage, its emitter connected via a resistor 51 to the −5V supply voltage, and its collector connected to the drain and gate of a PMOS transistor 52 whose source is connected to the +5V supply voltage. The transistor 52 constitutes an input transistor of a current mirror arrangement also comprising a PMOS transistor 53 having its source connected to the +5V supply voltage and its gate connected to the gate of the transistor 52. Thus the elements 50 to 53 of the circuit of FIG. 5 constitute a level shifter and current mirror arrangement which are matched to each of those in the circuit of FIG. 3.

The current of the PMOS transistor 53 is conducted via the source-drain path of a cascode-connected PMOS transistor 54, having its gate connected to the 0V supply voltage and serving to limit voltages of the transistors to within the technology limit of 6 volts, to an NMOS transistor 55 having its drain and gate connected together and to the drain of the transistor 54, and its source connected (as is permissible) to the −5V supply voltage. The transistor 55 constitutes an input transistor of a further current mirror also including an NMOS transistor 56, having its gate connected to the gate of the NMOS transistor 55 and its source connected to the −5V supply voltage.

Instead of the terminal A of the clamp circuit 35 being connected to the input terminal as shown in FIG. 3, using the circuit of FIG. 5 the terminal A is connected to the drain of the NMOS transistor 56. The junction of the terminal A with the drain of the transistor 56 is also connected to the drain of a further PMOS transistor 57, whose source is connected to the 0V supply voltage and whose gate is connected to the output of an inverter 58 having the input signal supplied to its input. The inverter 58 can be a known CMOS inverter with supply voltages constituted by the 0V and −5V supply voltages, and can be constituted by the inverter 34 shown in FIG. 3.

In operation of the circuit of FIG. 5, with a logic 0 input signal at a voltage of about −5 volts, the output of the inverter 58 is about 0 volts so that the PMOS transistor is non-conductive and this transistor has no effect. A controlled current dependent upon the resistance of the resistor 51, mirrored with desired gains by the current mirrors comprising the transistors 52 and 53 and the transistors 55 and 56, is allowed to flow via the terminal A of the clamp circuit 35. This controlled current arrangement, which controls the pull-down transistor 18, closely resembles that described above for the pull-up transistor 10, so that the two arrangements can be matched or tailored to provide very similar transition characteristics for both directions of transition between output logic levels.

When the input signal becomes a logic 1 with a voltage of about 0 volts, a voltage of about −5 volts is produced at the output of the inverter 58, so that the transistor 57 also becomes conductive. In this case the current which flows via the transistor 56 is constituted by the limited current flowing via the clamp circuit 35 as described above together with current supplied via the conductive transistor 57.

It can be appreciated that the circuit of FIG. 5 provides for a controlled current flow via the terminal A of the clamp circuit 35 when the input signal is a logic zero. Current control can also, or alternatively, be provided for the emitter currents of the transistors 28, 30, and 32, for example by replacing the resistors 29, 31, and 33 respectively with controlled current circuits, to provide a more comprehensive current control for the circuit.

Although embodiments of the invention have been described above in the context of a signal voltage converter, it can be appreciated that the same principles can be applied to other MOS circuits having a supply voltage (e.g. −5V) which is more negative than a voltage (e.g. 0V) to which an output signal is to be pulled down, regardless of whether or not there is any overall conversion of signal voltages. Thus for example the circuit of FIG. 3 could be modified to respond to an input signal having logic levels between 0 and +5 volts instead of between −5 and 0 volts as described above.

Thus although particular embodiments of the invention have been described in detail above, it can be appreciated that these and numerous other modifications, variations, and adaptations may be made without departing from the scope of the invention as defined in the claims.

What is claimed is:

1. A MOS transistor output circuit having terminals for relatively positive, zero, and negative supply voltages, comprising:
    a first PMOS transistor having a source connected to the positive supply voltage, a gate, and a drain connected to an output;
    a second PMOS transistor having a source connected to the output, a gate, and a drain connected to the zero supply voltage;
    at least one current mirror arrangement comprising at least a third PMOS transistor having a source connected to the positive supply voltage, a gate, and a drain, the at least one current mirror arrangement being responsive to an input signal for controlling the first and third PMOS transistors via their gates to be simultaneously conductive and simultaneously non-conductive for respective logic levels of the input signal;
    a fourth PMOS transistor having a source coupled to the drain of the third PMOS transistor, a gate coupled to the zero voltage supply, and a drain coupled to the gate of the second PMOS transistor; and
    a clamp circuit coupled to the gate of the second PMOS transistor and responsive to the input signal for supplying a relatively positive or negative voltage to the gate of the second PMOS transistor, to render the second PMOS transistor respectively non-conductive or conductive, when the first and third PMOS transistors are respectively conductive and non-conductive.

2. An output circuit as claimed in claim 1 wherein the at least one current mirror arrangement comprises two current mirror arrangements each for controlling a respective one of the first and third PMOS transistors.

3. An output circuit as claimed in claim 1 wherein the input signal has voltages between the zero and negative supply voltages, the output circuit further comprising at least one level shifter responsive to the input signal for conducting an input current of said at least one current mirror arrangement, the at least one level shifter comprising an NPN bipolar transistor having a base coupled to the zero supply voltage, an emitter coupled via a resistor to a signal path, and a collector coupled to the at least one current mirror arrangement.

4. An output circuit as claimed in claim 3 wherein the at least one current mirror arrangement comprises two current mirror arrangements each for controlling a respective one of the first and third PMOS transistors, and the at least one level shifter comprises two level shifters each coupled to a respective one of the two current mirror arrangements.

5. An output circuit as claimed in claim 3 wherein the signal path comprises an output of a CMOS inverter connected to the zero and negative supply voltages and having an input responsive to the input signal.

6. An output circuit as claimed in claim 5 and comprising a further current mirror arrangement and a further level shifter responsive to the input signal for conducting an input current of the further current mirror arrangement, the further current mirror arrangement being coupled to the at least one current mirror arrangement for reducing the input current to the at least one current mirror arrangement in response to a change in the input signal to render the first and third PMOS transistors non-conductive.

7. An output circuit as claimed in claim 3 wherein the clamp circuit comprises a first terminal responsive to the input signal; a second terminal coupled to the gate of the second PMOS transistor; and a third terminal coupled to the zero supply voltage; a potential divider coupled between the first and second terminals; an NPN bipolar transistor having a base coupled to a tapping point of the potential divider, an emitter coupled to the first terminal, and a collector coupled to the second terminal; a path between the third terminal and the base of the transistor comprising a resistor and at least one diode for conducting current when the first terminal is at a negative voltage; and a path between the third terminal and the collector of the transistor including said resistor and at least one other diode for conducting current when the first terminal is at a negative voltage.

8. An output circuit as claimed in claim 7 and further comprising a controlled current circuit responsive to the input signal and having an output to which the first terminal of the clamp circuit is coupled, the controlled current circuit being arranged to conduct a controlled current for the clamp circuit when the second PMOS transistor is conductive.

9. An output circuit as claimed in claim 1 and further comprising a controlled current circuit responsive to the input signal and having an output to which the clamp circuit is coupled, the controlled current circuit being arranged to conduct a controlled current for the clamp circuit when the second PMOS transistor is conductive.

10. A MOS transistor signal voltage converter having relatively positive, zero, and negative supply voltages for converting an input signal having logic levels represented by voltages at about the zero and negative supply voltages to an output signal having logic levels represented by voltages at about the positive and zero supply voltages, the converter comprising:
    a first PMOS transistor having a source connected to the positive supply voltage, a gate, and a drain connected to an output for the output signal;
    a second PMOS transistor having a source connected to the output, a gate, and a drain connected to the zero supply voltage;
    at least one level shifter comprising an NPN bipolar transistor having a base coupled to the zero supply voltage, an emitter coupled to a signal path responsive to the input signal, and a collector;
    at least one current mirror arrangement coupled to the collector of the at least one level shifter and including at least a third PMOS transistor having a source connected to the positive supply voltage, a gate, and a drain, the at least one current mirror arrangement being responsive to current conducted by the transistor of the at least one level shifter to control the first and third PMOS transistors via their gates to be simultaneously conductive and simultaneously non-conductive for respective logic levels of the input signal;

a fourth PMOS transistor having a source coupled to the drain of the third PMOS transistor, a gate coupled to the zero voltage supply, and a drain coupled to the gate of the second PMOS transistor; and a clamp circuit coupled to the gate of the second PMOS transistor and responsive to the input signal for controlling the second PMOS transistor to be respectively non-conductive and conductive when the first and third PMOS transistors are respectively conductive and non-conductive.

11. A signal voltage converter as claimed in claim 10 wherein the at least one level shifter and the at least one current mirror arrangement comprise two level shifters and two current mirror arrangements each coupled to a respective one of the two level shifters for controlling a respective one of the first and third PMOS transistors.

12. A signal voltage converter as claimed in claim 11 and comprising a CMOS inverter connected to the zero and negative supply voltages, having an input responsive to the input signal and an output constituting said signal path.

13. A signal voltage converter as claimed in claim 12 and comprising a further current mirror arrangement and a further level shifter responsive to the input signal for conducting an input current of the further current mirror arrangement, the further current mirror arrangement being coupled to said two current mirror arrangements for conducting the current of the transistors of the two level shifters in response to a change in the input signal to render the first and third PMOS transistors non-conductive.

14. A signal voltage converter as claimed in claim 10 and comprising a CMOS inverter connected to the zero and negative supply voltages, having an input responsive to the input signal and an output constituting said signal path.

15. A signal voltage converter as claimed in claim 14 and comprising a further current mirror arrangement and a further level shifter responsive to the input signal for conducting an input current of the further current mirror arrangement, the further current mirror arrangement being coupled to the at least one current mirror arrangement for conducting the current of the transistor of the at least one level shifter in response to a change in the input signal to render the first and third PMOS transistors non-conductive.

16. A signal voltage converter as claimed in claim 15 wherein the clamp circuit comprises a first terminal responsive to the input signal; a second terminal coupled to the gate of the second PMOS transistor; and a third terminal coupled to the zero supply voltage; a potential divider coupled between the first and second terminals; an NPN bipolar transistor having a base coupled to a tapping point of the potential divider, an emitter coupled to the first terminal, and a collector coupled to the second terminal; a path between the third terminal and the base of the transistor comprising a resistor and at least one diode for conducting current when the first terminal is at about the negative supply voltage; and a path between the third terminal and the collector of the transistor including said resistor and at least one other diode for conducting current when the first terminal is at about the negative supply voltage.

17. A signal voltage converter as claimed in claim 16 and further comprising a controlled current circuit responsive to the input signal and having an output to which the first terminal of the clamp circuit is coupled, the controlled current circuit being arranged to conduct a controlled current for the clamp circuit when the second PMOS transistor is conductive.

18. A signal voltage converter as claimed in claim 10 wherein the clamp circuit comprises a first terminal responsive to the input signal; a second terminal coupled to the gate of the second PMOS transistor; and a third terminal coupled to the zero supply voltage; a potential divider coupled between the first and second terminals; an NPN bipolar transistor having a base coupled to a tapping point of the potential divider, an emitter coupled to the first terminal, and a collector coupled to the second terminal; a path between the third terminal and the base of the transistor comprising a resistor and at least one diode for conducting current when the first terminal is at about the negative supply voltage; and a path between the third terminal and the collector of the transistor including said resistor and at least one other diode for conducting current when the first terminal is at about the negative supply voltage.

19. A signal voltage converter as claimed in claim 18 and further comprising a controlled current circuit responsive to the input signal and having an output to which the first terminal of the clamp circuit is coupled, the controlled current circuit being arranged to conduct a controlled current for the clamp circuit when the second PMOS transistor is conductive.

20. A signal voltage converter as claimed in claim 10 and further comprising a controlled current circuit responsive to the input signal and having an output to which the first terminal of the clamp circuit is coupled, the controlled current circuit being arranged to conduct a controlled current for the clamp circuit when the second PMOS transistor is conductive.

* * * * *